United States Patent
Tsuchida

(10) Patent No.: US 6,882,565 B2
(45) Date of Patent: Apr. 19, 2005

(54) MRAM HAVING CURRENT PEAK SUPPRESSING CIRCUIT

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/695,857

(22) Filed: Oct. 30, 2003

(65) Prior Publication Data

US 2005/0047205 A1 Mar. 3, 2005

(30) Foreign Application Priority Data

Aug. 25, 2003  (JP) ........................................ 2003-300509

(51) Int. Cl.$^7$ ............................................. G11C 11/14
(52) U.S. Cl. ...................................... 365/171; 365/158
(58) Field of Search ................................. 365/171, 158

(56) References Cited

U.S. PATENT DOCUMENTS

| 6,356,477 | B1 |   | 3/2002 | Tran |         |
|-----------|----|---|--------|------|---------|
| 6,456,524 | B1 | * | 9/2002 | Perner et al. | 365/158 |
| 6,667,655 | B1 | * | 12/2003 | Chow et al. | 327/545 |
| 6,724,653 | B1 | * | 4/2004 | Iwata et al. | 365/158 |

OTHER PUBLICATIONS

Roy Scheuerlein, et al., "A 10ns Read and Write Non–Volatile Memory Array Using a Magnetic Tunnel Junction and FET Switch in each Cell", ISSCC 2000 Digest of Techincal Paper, International Solid–State Circuits Conference, Session 7 /TD: Emerging Memory & Device Technologies, Feb. 8, 2000, pp. 128–129.

Takeshi Honda, et al., "MRAM–Writing Circuitry to Compensate for Thermal–Variation of Magnetization–Reversal Current", 2002 Symposium on VLSI Circuits Digest of Technical Papers, 2002, 1 page.

* cited by examiner

*Primary Examiner*—Van Thu Nguyen
*Assistant Examiner*—Tuan T. Nguyen
(74) *Attorney, Agent, or Firm*—Oblon, Spivak, McClelland, Maier & Neustadt, P.C.

(57) ABSTRACT

An MRAM that employs a constant current write method includes a constant current circuit for a write, which is connected to a first power supply, and switch circuits which are connected to the constant current circuit to selectively drive a write line. In the MRAM, before the write current application timing, the node at one of the terminals of each of the switch circuits is short-circuited to the power supply to which the constant current source is connected.

20 Claims, 18 Drawing Sheets

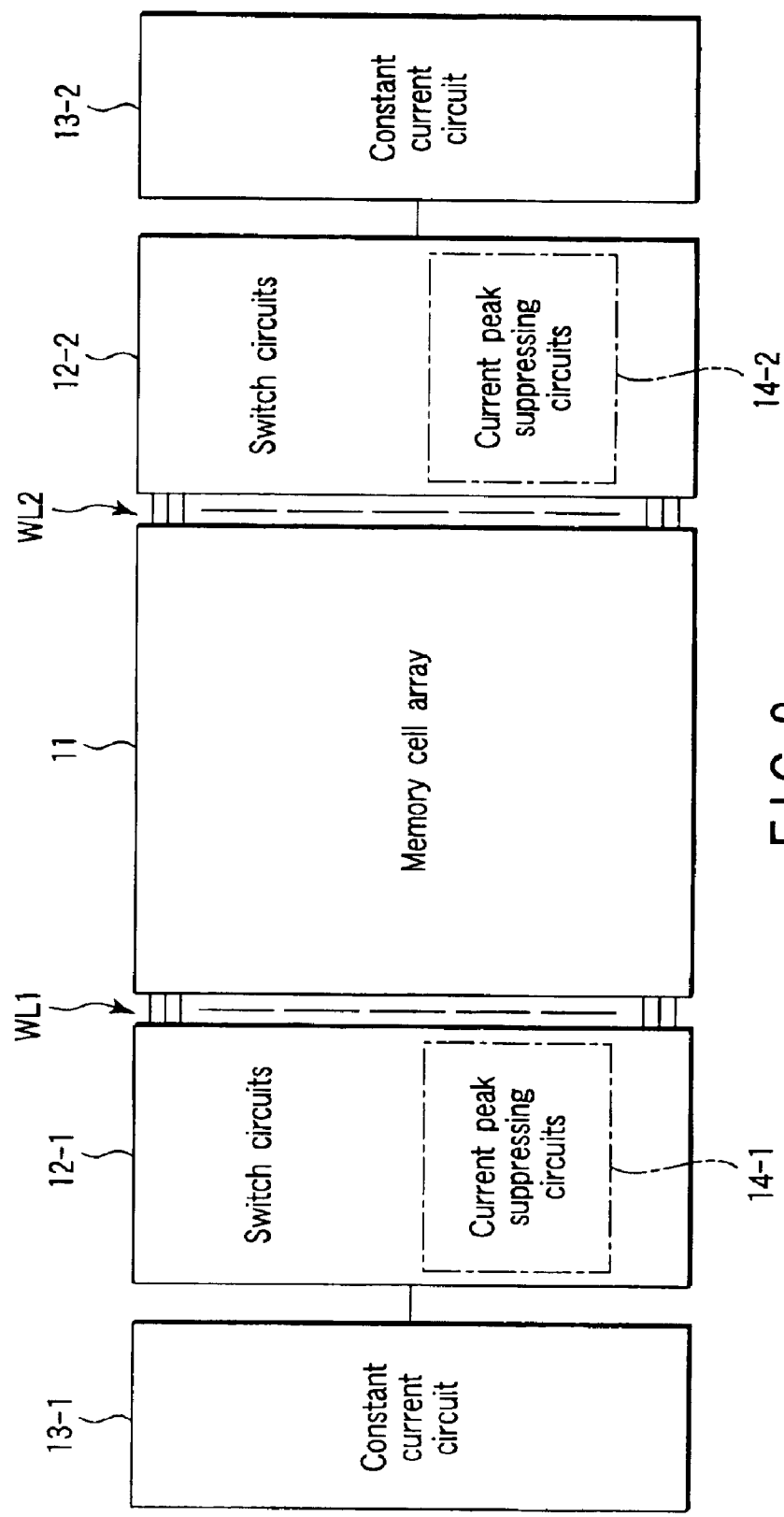
F I G. 2

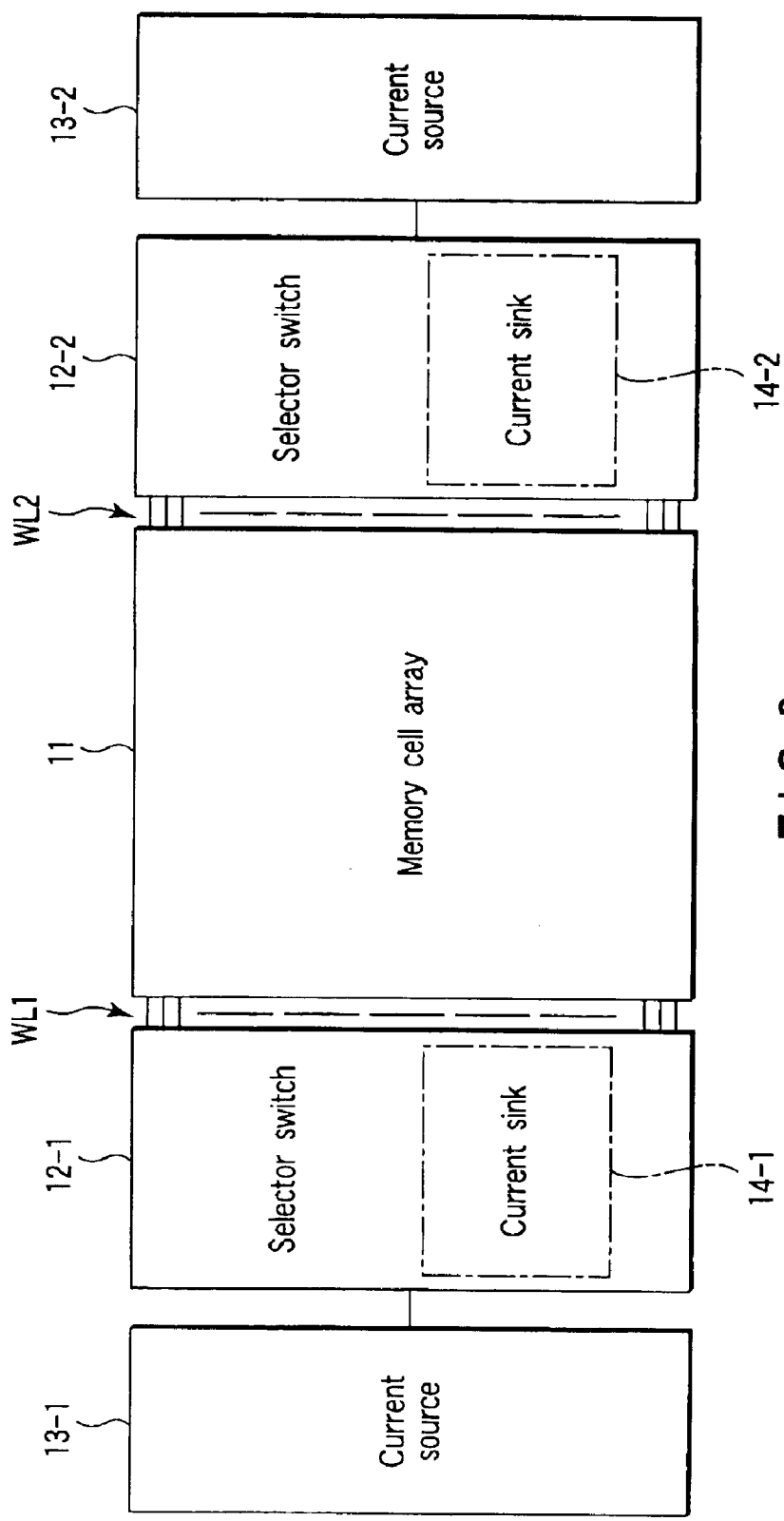
F I G. 3

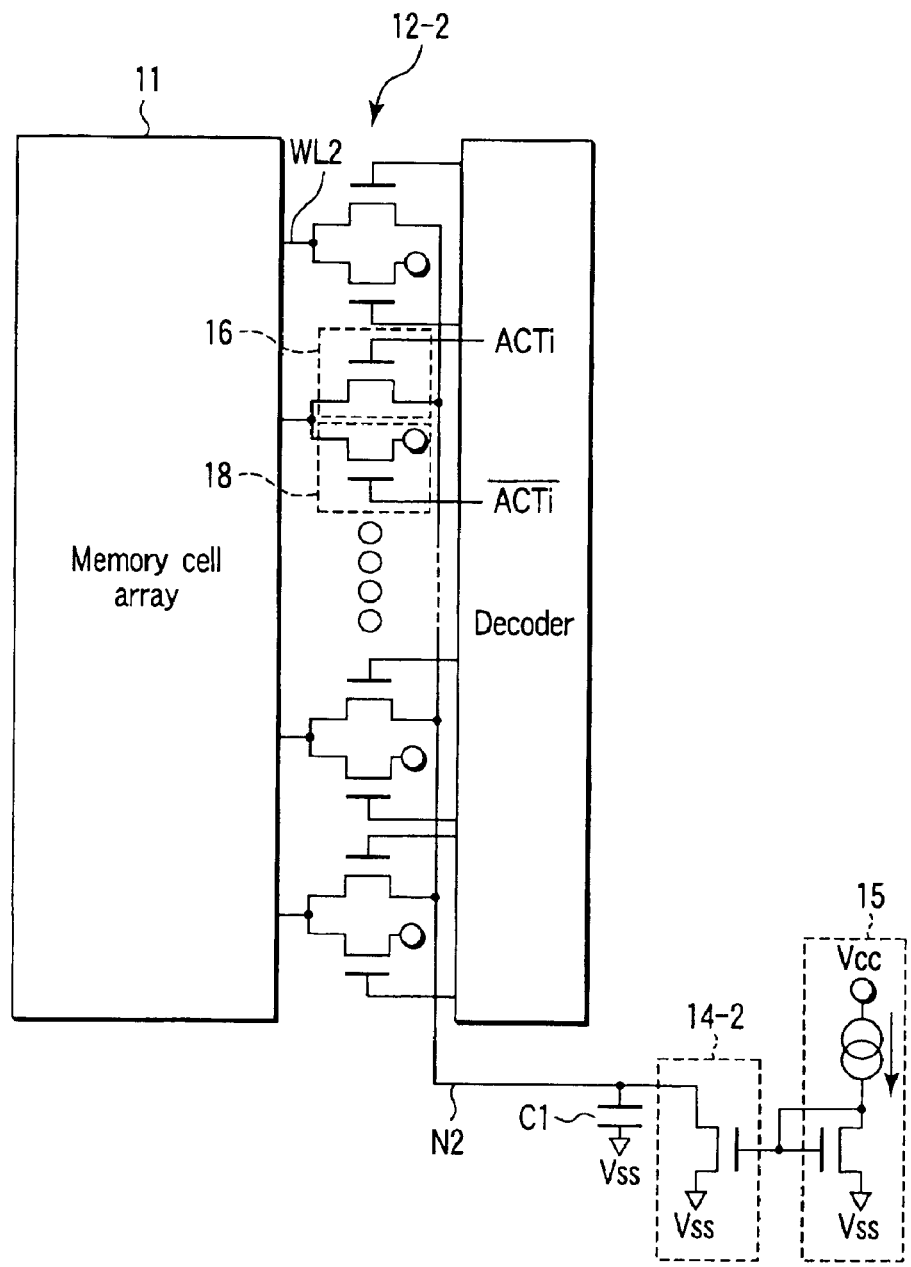
F I G. 8

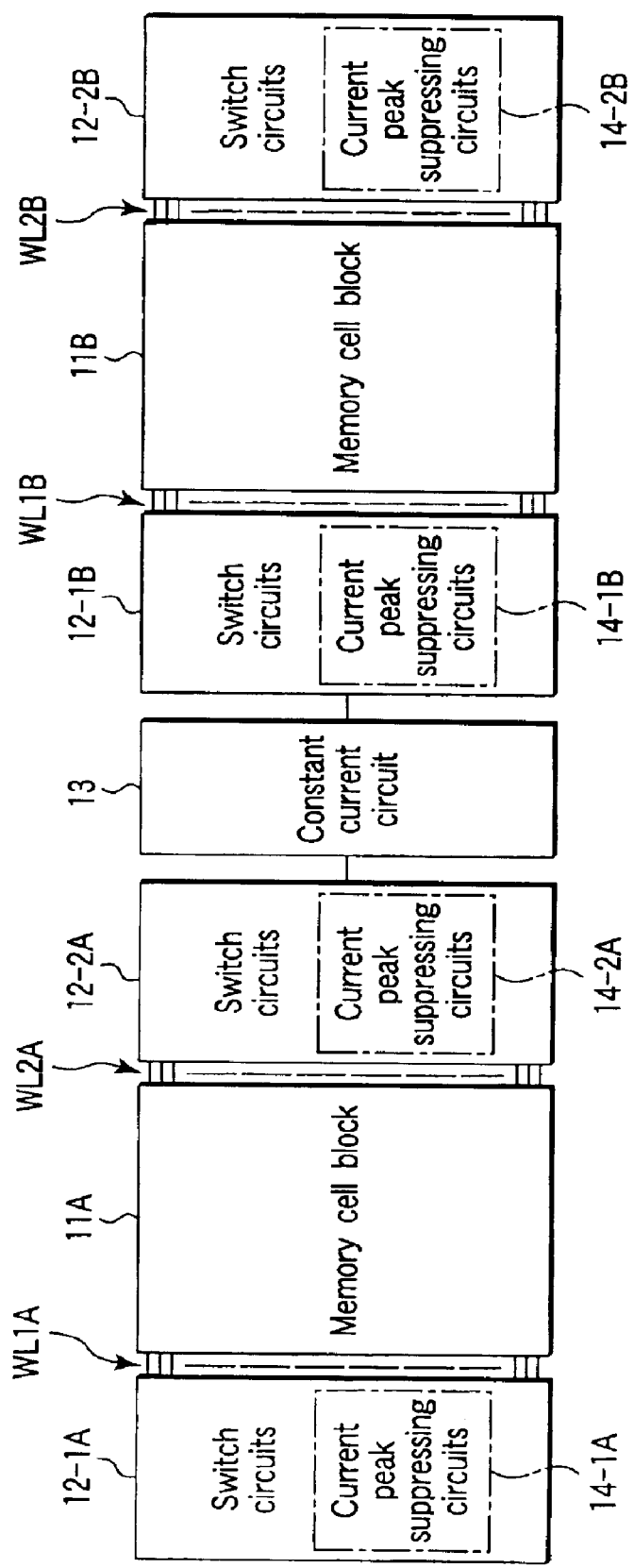
F I G. 9

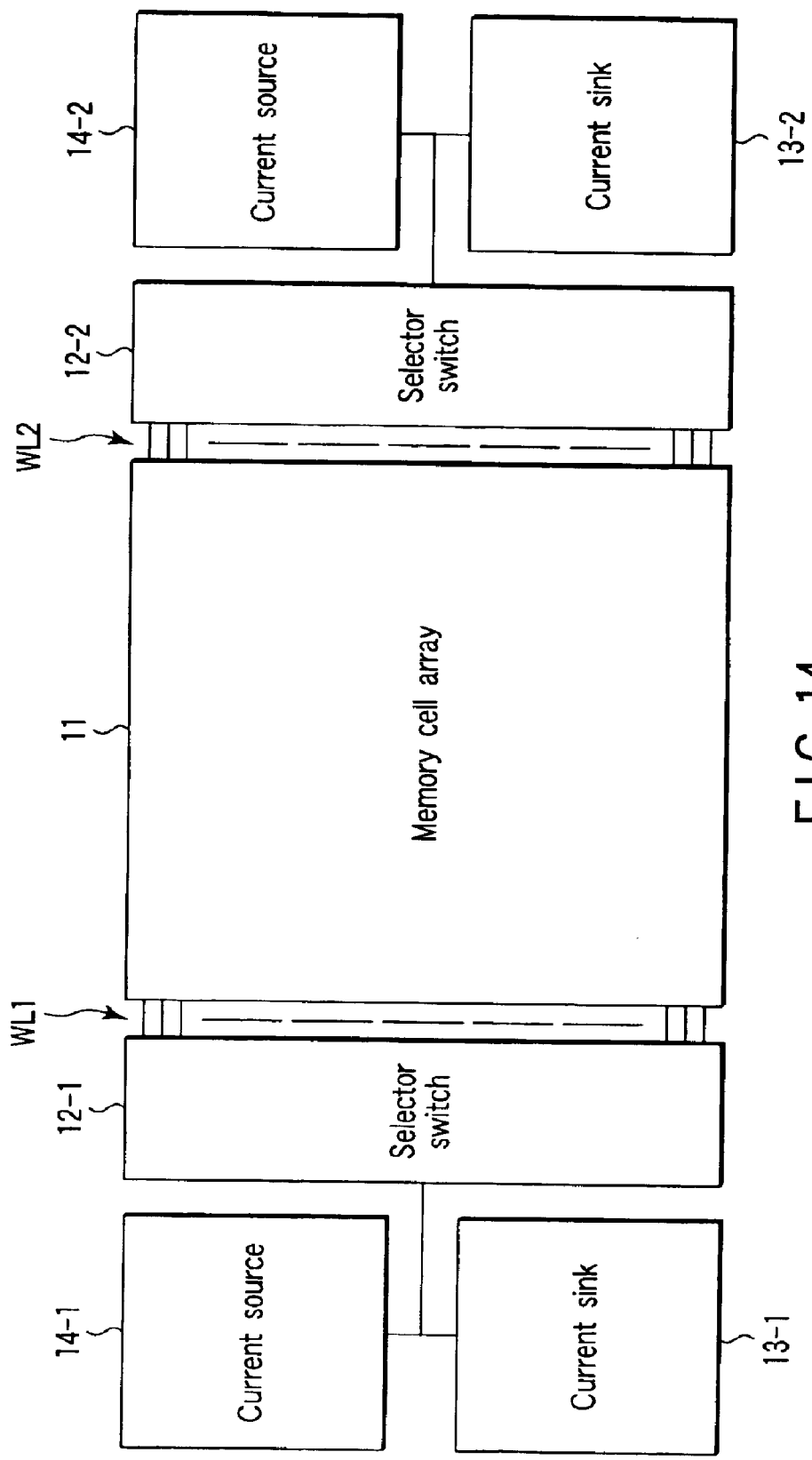
F I G. 14

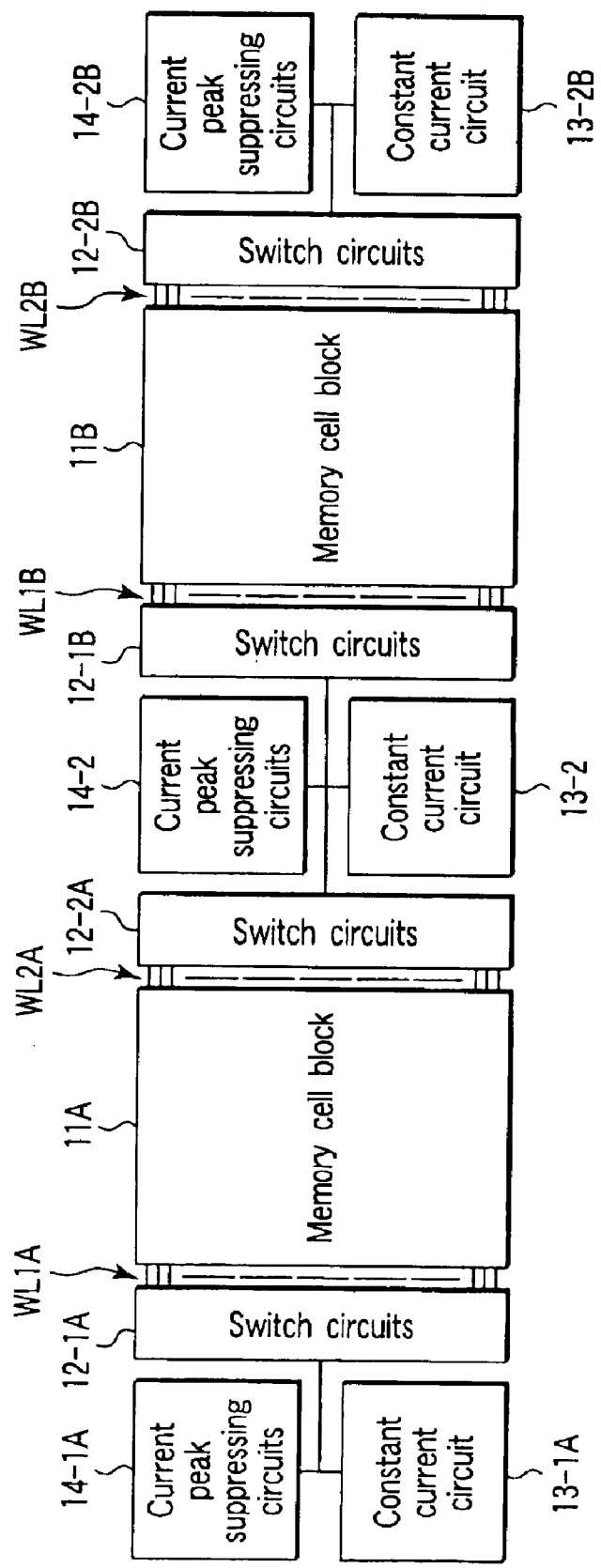
F I G. 17

To first MRAM data rewrite control section

MRAM HAVING CURRENT PEAK SUPPRESSING CIRCUIT

CROSS-REFERENCE TO RELATED APPLICATIONS

This application is based upon and claims the benefit of priority from the prior Japanese Patent Application No. 2003-300509, filed Aug. 25, 2003, the entire contents of which are incorporated herein by reference.

BACKGROUND OF THE INVENTION

1. Field of the Invention

The present invention relates to a technique for implementing a semiconductor integrated circuit device such as a magnetic random access memory (MRAM) which has, as a single memory cell, an element structure for storing "1" or "0" information by using a magneto-resistive effect, integrates and arranges the memory cells in a matrix, and adds control circuits such as a decoder circuit and sense circuit to the peripheral portion of the memory cells so as to allow a read operation or a write operation by random-access to an arbitrary bit and, more particularly, to an MRAM which has a current peak suppressing circuit which suppresses a current peak generated immediately after the start of the write operation.

2. Description of the Related Art

An MRAM is a device which performs a memory operation by storing "1" or "0" information by using a magneto-resistive effect. MRAMs are expected as one of candidates of universal memory devices capable of realizing nonvolatility, high integration, high reliability, low power consumption, and high-speed operation and are being developed by various manufacturers.

There are two well-known magneto-resistive effects: GMR (Giant Magneto-Resistive) and TMR (Tunneling Magneto-Resistive) effects. The GMR effect uses a phenomenon in which the resistance of a conductive member sandwiched between two ferromagnetic layers changes depending on the direction of spin in the upper and lower ferromagnetic layers. However, the MR ratio that indicates the ratio of a change in magneto-resistance value is as low as about 10%. For this reason, a read signal of stored information is small. The most difficult point for implementation of an MRAM is how to ensure the read margin. An MRAM of this type is therefore presently regarded as impractical.

As a typical element that exhibits a TMR effect, an MTJ (Magnetic Tunnel Junction) element is known. An MTJ element has a multilayered structure including an insulating film sandwiched between two ferromagnetic layers made of a metal and utilizes a change in magneto-resistance due to a spin polarization tunneling effect. More specifically, when the spin directions of the two, upper and lower magnetic layers of an MTJ element are parallel, the tunnel probability between the two magnetic layers through the tunnel insulating film is maximized. As a result, the resistance value is minimized. On the other hand, when the spin directions are anti-parallel, the tunnel probability is minimized. Accordingly, the resistance value is maximized. To realize the two spin states, one of the two magnetic films normally has a fixed magnetization direction and is set not to be influenced by external magnetization. This layer is generally called a pinning layer. The magnetization direction of the other magnetic film can be programmed by the direction of an applied magnetic field to be parallel or anti-parallel to that of the pinning layer. This layer is generally called a free layer. The free layer stores information. There are currently some MTJ elements which have a resistance change ratio, i.e., an MR ratio of 50% or more. They are becoming the mainstream of MRAM development.

In writing data in an MRAM using MTJ elements, to reverse the magnetization direction of the free layer, a current having a predetermined value or more is supplied to bit and word lines which pass through the respective memory cells while running perpendicularly to each other. The magnetization direction of the free layer is controlled by the magnitude of the generated synthetic magnetic field.

In a read, a voltage is applied between the two magnetic films of an MTJ element corresponding to a selected bit, and the resistance value is read from the current flowing through the MTJ element. Alternatively, a constant current is supplied to a selected MTJ element, and a voltage generated between the two magnetic layers is read out.

An example of an MRAM using such an MTJ element is reported in, e.g., "A 10 ns Read and Write Non-Volatile Memory Array using a Magnetic Tunnel Junction and FET Switch in each Cell", ISSCC 2000 Digest of Technical Paper, p. 128 (paper 1). In addition, a detailed example of the arrangement of the write circuit in the MRAM is reported in, e.g., "MRAM-Writing Circuitry to Compensate for Thermal-Variation of Magnetization-Reversal Current", 2002 Symposium on VLSI Circuits Digest of Technical Papers, p. 156 (paper 2).

FIG. 1 shows the detailed example of the arrangement of the write circuit described in paper 2. The technique disclosed in paper 2 is based on a constant current write method. In this technique, a plurality of selector circuits are connected to one constant current source and selectively operated in accordance with an address input, thereby selectively supplying a current to a cell to be write-accessed.

In this method, however, a current source output line represented by a node A or B has a relatively large parasitic capacitance. It mainly contains the parasitic capacitance of the output line from the current source and the diffusion capacitance of the plurality of selector circuit portions. Additionally, as shown in FIG. 1, the PMOS transistor serving as the current source is normally ON. In the standby state, the node A or B is therefore charged to the power supply voltage (Vcc) as the source potential of the PMOS transistor. If the MRAM is activated in this state, and a write operation request is issued, a current is supplied to a specific write line in accordance with an externally input address. The current source controls to prevent any current more than necessary from flowing to the selected memory cell. However, a current having a predetermined value or more flows due to the charged current from the relatively large parasitic capacitance. Especially, a large current peak is generated immediately after the start of the write operation. When a stable state is obtained, the effect of current control by the current source appears. However, if the current peak immediately after the start of the write operation is large, a write error occurs in all cells connected to the write line. This problem is predicted to become more conspicuous as the number of repetition of selector circuits increases or the parasitic capacitance of the output line from the current source increases in accordance with the increase in chip size.

As described above, in the conventional semiconductor integrated circuit device, a large current peak is generated immediately after the start of the write operation. This decreases the write operation margin and lowers the reliability.

BRIEF SUMMARY OF THE INVENTION

According to an aspect of the present invention, there is provided a semiconductor integrated circuit device comprising a memory cell array in which memory cells each of which stores information by using a magneto-resistive effect are arranged in a matrix, a constant current circuit which is connected to a first potential supply source and used to write data in each memory cell in the memory cell array, and a current peak suppressing circuit configured to suppress a current peak that is generated at a write start timing due to charges which flow out from a parasitic capacitance connected to an output terminal of the constant current circuit or charges which flow into the parasitic capacitance, the current peak suppressing circuit having switch circuits to selectively supply an output from the constant current circuit to a specific write line, and a circuit portion which connects one of two terminals of each of the switch circuits to a second potential supply source having a potential different from that of the first potential supply source before the timing of the start of the write operation and short-circuits the two terminals of each of the switch circuits immediately after the start of the write operation.

According to another aspect of the present invention, there is provided a semiconductor integrated circuit device comprising a plurality of memory cell blocks in which memory cells each of which stores information by using a magneto-resistive effect are arranged in a matrix, a constant current circuit which is used to write data in each memory cell in the memory cell blocks, the constant current circuit being shared by two adjacent memory cell blocks, switch circuits which are arranged in correspondence with each memory cell block and configured to selectively connect an output from the constant current circuit to a specific write line, and a current peak suppressing circuit configured to suppress a current peak at a timing of a start of a write operation.

According to still anther aspect of the present invention, there is provided a semiconductor integrated circuit device comprising a plurality of memory cell blocks in which memory cells each of which stores information by using a magneto-resistive effect are arranged in a matrix, a constant current circuit which is used to write data in each memory cell in the memory cell blocks, switch circuits which are arranged in correspondence with each memory cell block and configured to selectively connect an output from the constant current circuit to a specific write line, and a current peak suppressing circuit configured to suppress a current peak at a timing of a start of a write operation, wherein the constant current circuit and the current peak suppressing circuit are shared by two adjacent memory cell blocks.

According to still another aspect of the present invention, there is provided a semiconductor integrated circuit device comprising write lines to write information in memory cells each of which stores information by using a magneto-resistive effect, a constant current circuit which is connected to a first potential supply source and used to write data in the memory cells, switch circuits each having one terminal connected to a corresponding one of the write lines and the other terminal connected to an output terminal of the constant current circuit in parallel, and a current peak suppressing circuit which has a circuit portion to which one terminal of each of the switch circuits is connected and is configured to connect one of the two terminals of each of the switch circuits to a second potential supply source having a potential different from that of the first potential supply source before a timing of a start of a write operation and short-circuit the two terminals of each of the switch circuits immediately after the start of the write operation.

BRIEF DESCRIPTION OF THE SEVERAL VIEWS OF THE DRAWING

FIG. 2 is a block diagram showing a main core portion related to a write for an MRAM so as to explain a semiconductor integrated circuit device according to the first embodiment of the present invention;

FIG. 3 is a block diagram obtained by rewriting the block diagram shown in FIG. 2 by using an actual circuit names to be used in a write operation;

FIG. 8 is a circuit diagram showing a detailed example of the arrangement of a current peak suppressing circuit in the MRAM shown in FIG. 7;

FIG. 9 is a block diagram showing a core portion related to a write for an MRAM so as to explain a semiconductor integrated circuit device according to the third embodiment of the present invention;

FIG. 14 is a block diagram showing a core portion related to a write for an MRAM so as to explain a semiconductor integrated circuit device according to the fifth embodiment of the present invention;

FIG. 17 is a block diagram showing a core portion related to a write for an MRAM so as to explain a semiconductor integrated circuit device according to the sixth embodiment of the present invention;

DETAILED DESCRIPTION OF THE INVENTION

First Embodiment

Figure 1:
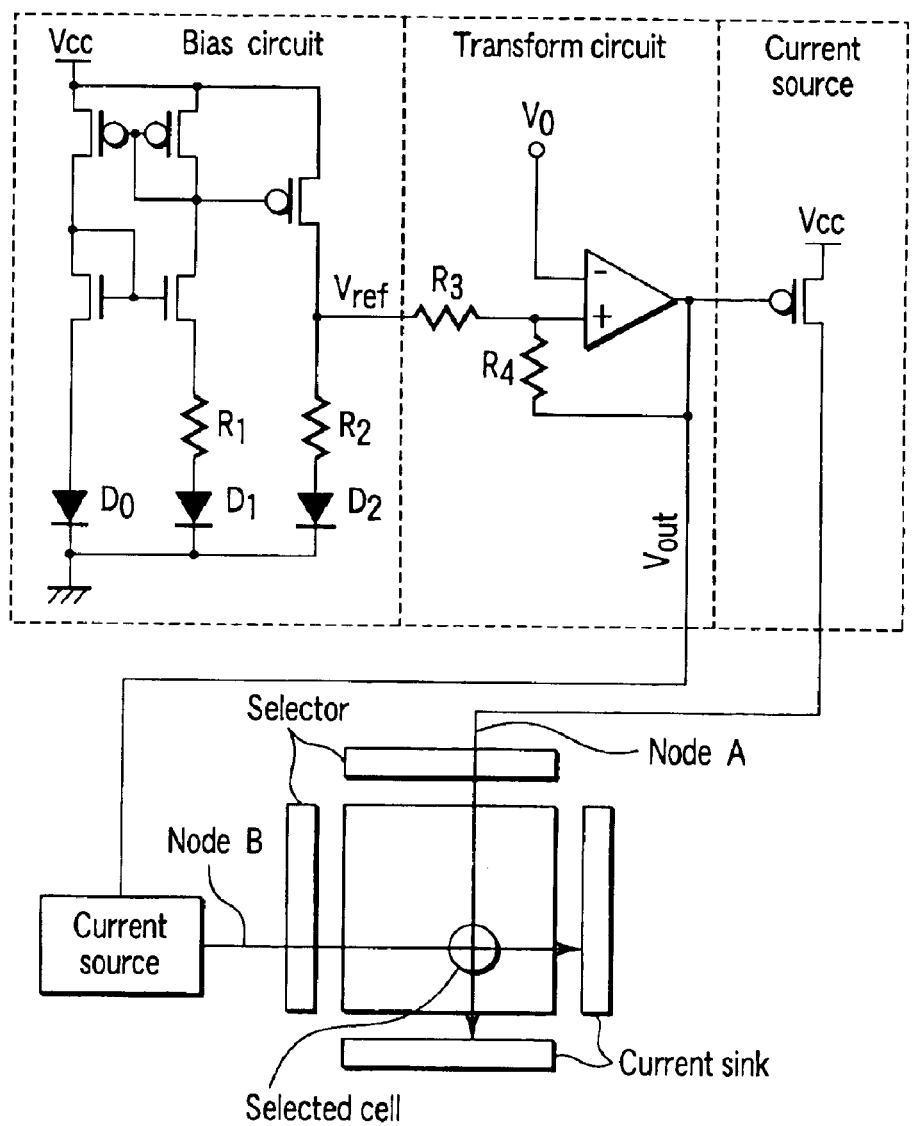
FIG. 1 is a circuit diagram showing an example of the arrangement of the write circuit of an MRAM so as to explain a conventional semiconductor integrated circuit device.

FIG. 2 is a block diagram showing a main core portion related to a write for an MRAM so as to explain a semiconductor integrated circuit device according to the first embodiment of the present invention. In this embodiment, switch circuits 12-1 and 12-2 which selectively supply currents to write lines WL1 and WL2 are arranged on both sides of a memory cell array 11 arranged at the center. Constant current sources 13-1 and 13-2 are connected to the switch circuits 12-1 and 12-2, respectively. The constant current sources (constant current circuits) 13-1 and 13-2 are arranged on both sides of the memory cell array 11 to obtain two current directions. The switch circuits 12-1 and 12-2 incorporate current peak suppressing circuits 14-1 and 14-2.

FIG. 3 is obtained by rewriting the block diagram shown in FIG. 2 by using an actual circuit names to be used in a write operation. The same reference numerals as in FIG. 2 denote the same circuit portions in FIG. 3. The MRAM realizes a write operation by a steady-state predetermined current. In this embodiment, therefore, a circuit which outputs a current will be referred to as a current source, and a circuit which receives a current will be referred to as a current sink. In the example shown in FIG. 3, a current source acts as a constant current circuit while a current sink also functions as a current peak suppressing circuit. Two circuits, i.e., a selector switch and a current sink are arranged in correspondence with each of the write lines WL1 and WL2.

Figure 4:
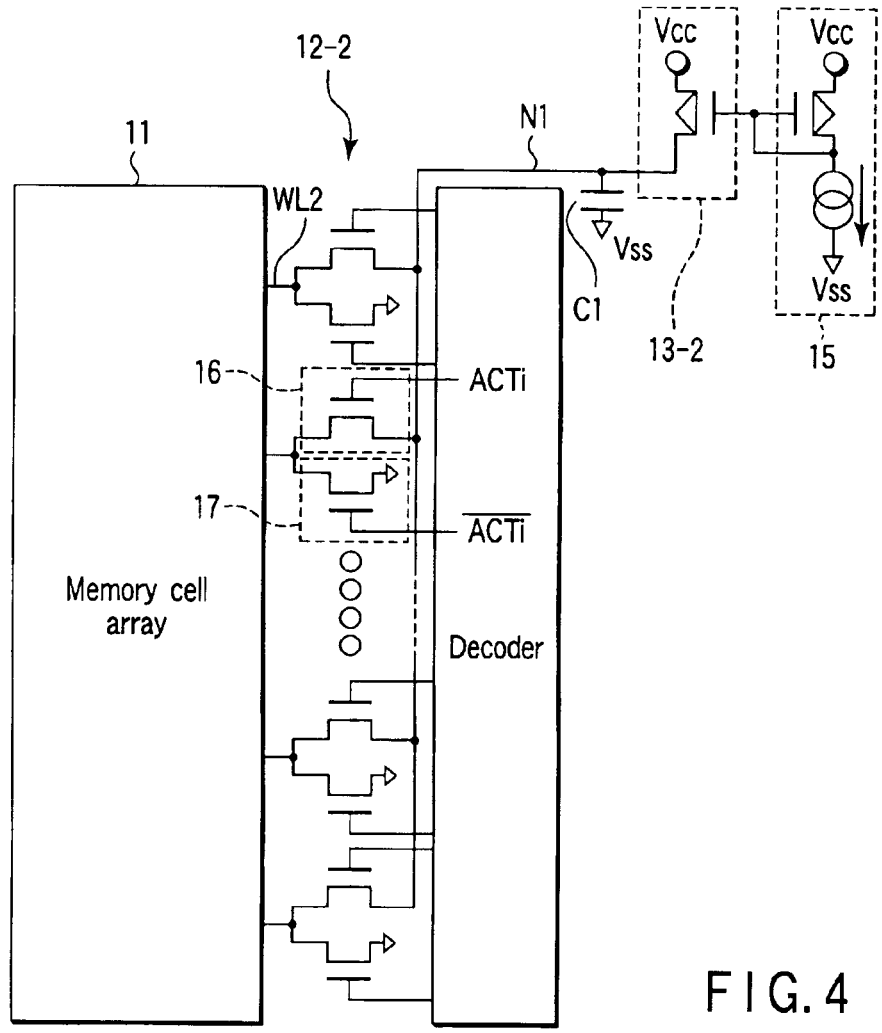
FIG. 4 is a circuit diagram showing a detailed example of the arrangement of a current peak suppressing circuit in the MRAM shown in FIG. 2.

FIG. 4 shows a detailed example of the circuit arrangement of the current peak suppressing circuit in the MRAM according to the first embodiment. At least one constant current control voltage generation circuit 15 is arranged in the chip. The output from the circuit 15 is input to the current source 13-2. FIG. 4 shows a circuit formed by connecting the constant current control voltage generation circuit 15 and current source 13-2 by current mirror connection. The output from the current source 13-2 is supplied to a common node N1 of the plurality of selector switches 12-2 and then to a desired number of selector elements (in this case, NMOS transistors each having a gate terminal for receiving a signal ACT) 16. For this reason, a capacitance C1 as the synthetic capacitance of a relatively large wiring capacitance and a parasitic capacitance formed by the diffusion capacitance of the NMOS transistors 16 is connected to the common node N1. The capacitance C1 is charged to a power supply voltage (Vcc) by the current source 13-2.

On the other hand, the common node N1 is connected to the write lines WL2 through the selector switches 12-2. A current sink 17 formed from an NMOS transistor whose gate terminal receives a signal /ACT is connected to each write line WL2. The current sink 17 functions as a current peak suppressing circuit. In the actual write operation, the current source 12-2 at the right end of the memory cell array 11 and the current sink 14-1 (not shown) at the left end are simultaneously activated to supply a steady-state current.

Figure 5:
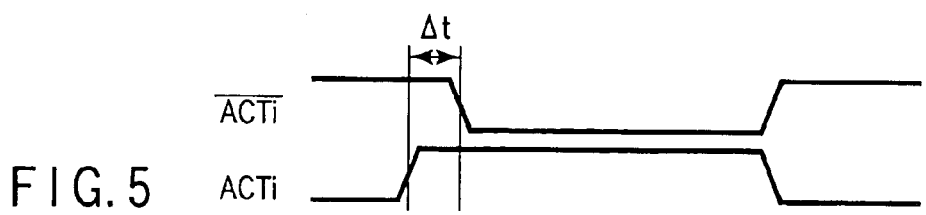
FIG. 5 is an operation timing chart of the current peak suppressing circuit shown in FIG. 4.

FIG. 5 shows an example of the operation timing of the circuit shown in FIG. 4. When all the gate signals /ACT of the current sinks 17 are set in the "high" state in the standby state, the write lines are set to the ground potential (Vss) in the initial state. On the other hand, when the signal ACT as the inverted signal of /ACT is supplied to the gate of each selector switch 16, all the selector switches 16 are turned off.

When a write operation request is received from the outside, in only signals ACTi and /ACTi connected to a selected cell in accordance with an address cause transition. At this time, as shown in FIG. 5, the transition of the signal /ACTi from "high" to "low" is delayed from the transition of the signal ACTi from "low" to "high" by a predetermined time Δt. Since each write line in the memory cell array 11 is connected to a plurality of memory cells, a wiring resistance having a predetermined value or more is present. In addition, the current sink 14-1 is connected to the left end of the memory cell array 11 to supply the steady-state current. For these reasons, the resistance value on the memory cell array side is larger by at least an amount corresponding to the "wiring resistance". When the timing difference as shown in FIG. 5 is set between the signals /ACTi and ACTi, charges accumulated in the parasitic capacitance C1 can be removed through the current sink whose gate receives the signal /ACTi. When the charges in the parasitic capacitance C1 are sufficiently removed to the side of the ground potential Vss, the signal /ACTi is OFF-controlled (high→low). Accordingly, the current peak generated at the start of the write can be reduced.

Figure 6:
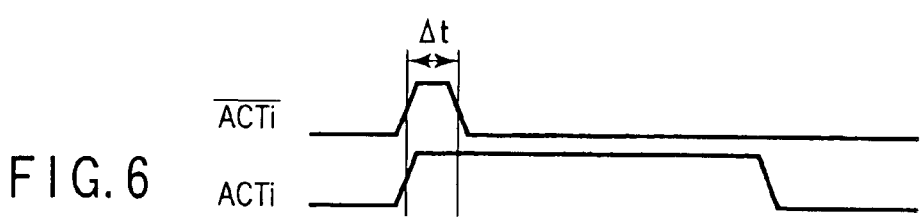
FIG. 6 is another operation timing chart of the current peak suppressing circuit shown in FIG. 4.

FIG. 6 shows another example of the operation timing of the circuit shown in FIG. 4. FIG. 6 is different from FIG. 5 in that all write lines are not connected to the ground potential Vss by the signal /ACT in the standby state. In this case, as shown in FIG. 6, the signal /ACTi is driven to a positive pulse shape at the initial timing of write current application, thereby activating the selector switch 16 and current sink 17 simultaneously. In this case as well, charges accumulated in the parasitic capacitance C1 can be removed through the current sink whose gate receives the signal /ACTi. When the charges in the parasitic capacitance C1 are sufficiently removed to the side of the ground potential Vss, the signal /ACTi is OFF-controlled (pulse-width-controlled). Accordingly, the current peak generated at the start of the write can be reduced.

Second Embodiment

Figure 7:
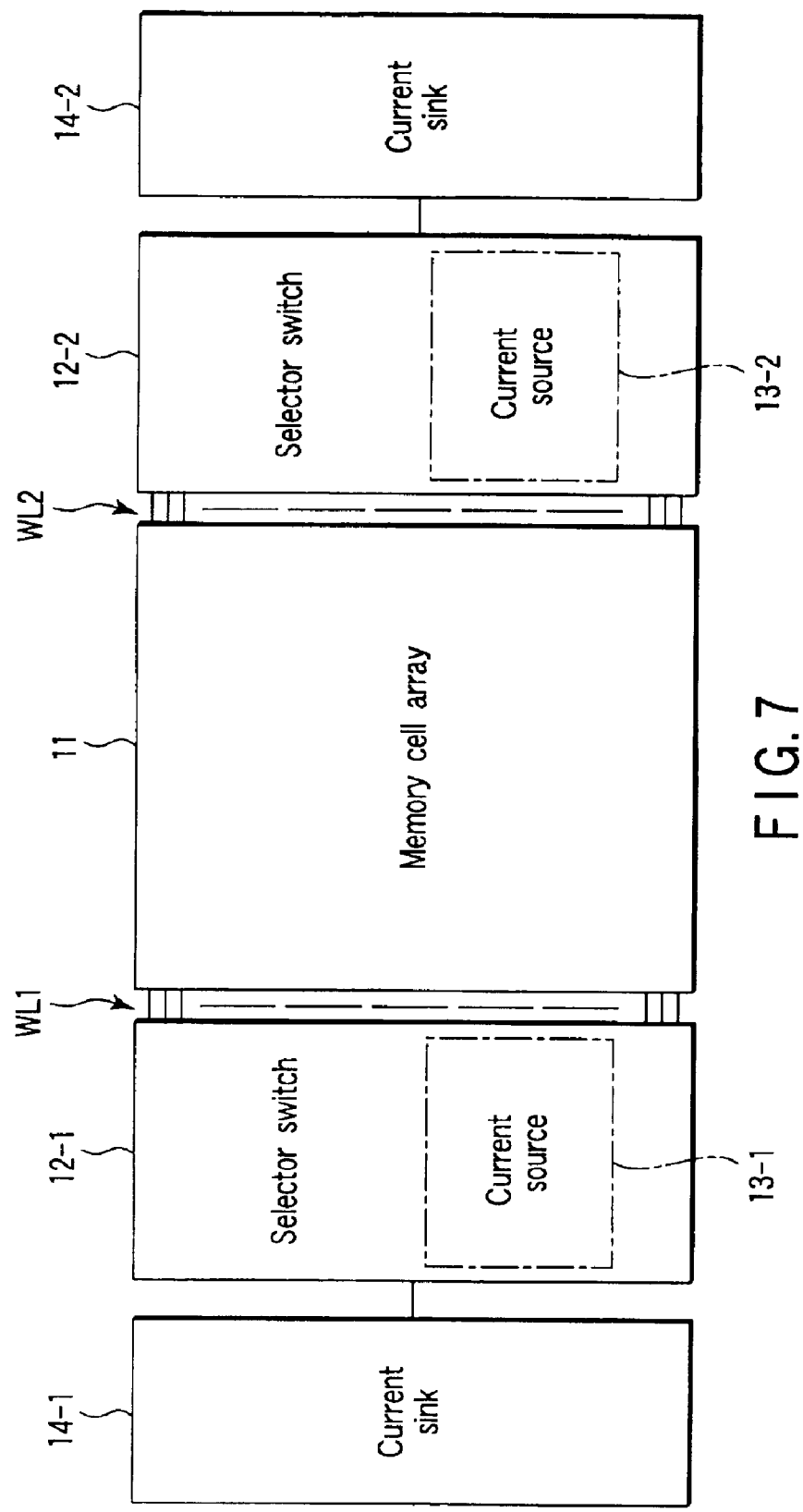
FIG. 7 is a block diagram showing a core portion related to a write for an MRAM so as to explain a semiconductor integrated circuit device according to the second embodiment of the present invention.

FIG. 7 is a block diagram showing a core portion related to a write for an MRAM so as to explain a semiconductor integrated circuit device according to the second embodiment of the present invention. FIG. 7 corresponds to FIG. 3 in the above-described first embodiment. The circuit shown in FIG. 7 is different from FIG. 3 in that current sinks 14-1 and 14-2 are separated, and two circuits, i.e., one of selector switches 12-1 and 12-2 and one of current sources 13-1 and 13-2 are arranged for each of write lines WL1 and WL2. In this circuit, the current sinks 14-1 and 14-2 act as constant current circuits while the current sources 13-1 and 13-2 also function as current peak suppressing circuits. The remaining fundamental components are the same as in the first embodiment. The same reference numerals as in FIG. 3 denote the same parts in FIG. 7, and a detailed description thereof will be omitted.

FIG. 8 shows a detailed example of the circuit arrangement of the current peak suppressing circuit in the MRAM according to the second embodiment. A constant current control voltage generation circuit 15 is incorporated on the side of the current sink 14-2. An output from the current sink 14-2 is supplied to a common node N2 of the plurality of selector switches 12-2 and then to a desired number of selector elements (NMOS transistors each having a gate terminal for receiving a signal ACT) 16. A capacitance C1 as the synthetic capacitance of a relatively large wiring capacitance and a parasitic capacitance formed by the diffusion capacitance of the NMOS transistors 16 is connected to the common node N2. The capacitance C1 is discharged to a ground potential (Vss) by the current sink 14-2.

The common node N2 is connected to the write lines WL2 through the selector switches 12-2. A current source 18 formed from an NMOS transistor whose gate terminal receives a signal /ACT is connected to each write line WL2. The current source 18 functions as a current peak suppressing circuit. In the actual write operation, the current sink 14-2 at the right end of a memory cell array 11 and the current source 12-1 (not shown) at the left end are simultaneously activated to supply a steady-state current.

The operation timing of the circuit shown in FIG. B is almost the same as those shown in FIGS. 5 and 6. In the operation timing shown in FIG. 5, the operation is the same as in the first embodiment except that all the write lines WL1 and WL2 are charged to a power supply voltage Vcc. At the start of the write operation, the parasitic capacitance C1 is charged from the current source so that the potential rises. As a result, the current peak to the write lines can be suppressed.

Even when the circuit is operated in accordance with the timing shown in FIG. 6, the same effect as described above can be expected.

Third Embodiment

FIG. 9 is a block diagram showing a main core portion related to a write for an MRAM so as to explain a semiconductor integrated circuit device according to the third embodiment of the present invention. This arrangement aims at reducing the chip size by causing two adjacent memory cell blocks 11A and 11B to share a constant current circuit 13. In an MRAM, generally, the write current is as large as several mA order. If an MRAM is implemented by using a constant current circuit using the saturation characteristic of a MOS transistor, a gate width of several hundred μm is necessary. When a plurality of constant current circuits having such a large gate width are mounted in a single chip, the chip size or chip cost increases. To prevent this, switch circuits 12-1A, 12-2A, 12-1B, and 12-2B (the switch circuits 12-1A, 12-2A, 12-1B, and 12-2B incorporate current peak suppressing circuits 14-1A, 14-2A, 14-1B, and 14-2B) are arranged on both sides of the memory cell blocks 11A and 11B. Adjacent blocks share the constant current circuit 13. With this arrangement, any increase in chip size can be suppressed.

Fourth Embodiment

Figure 10:
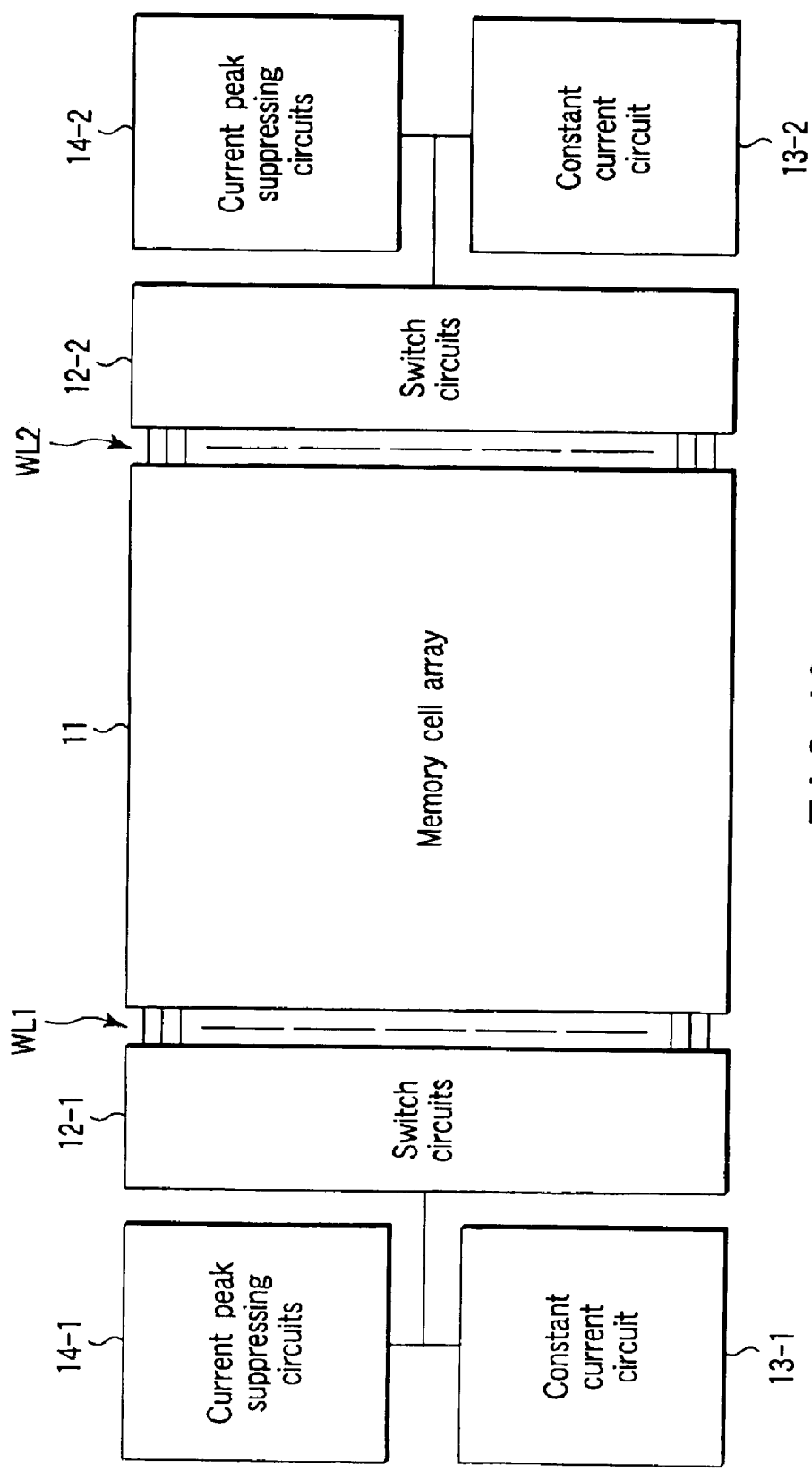
FIG. 10 is a block diagram showing a main core portion related to a write for an MRAM so as to explain a semiconductor integrated circuit device according to the fourth embodiment of the present invention.

FIG. 10 is a block diagram showing a main core portion related to a write for an MRAM so as to explain a semiconductor integrated circuit device according to the fourth embodiment of the present invention. This block diagram corresponds to FIG. 2. The circuit shown in FIG. 10 is different from FIG. 2 in that current peak suppressing circuits 14-1 and 14-2 are separated from switch circuits 12-1 and 12-2.

Figure 11:
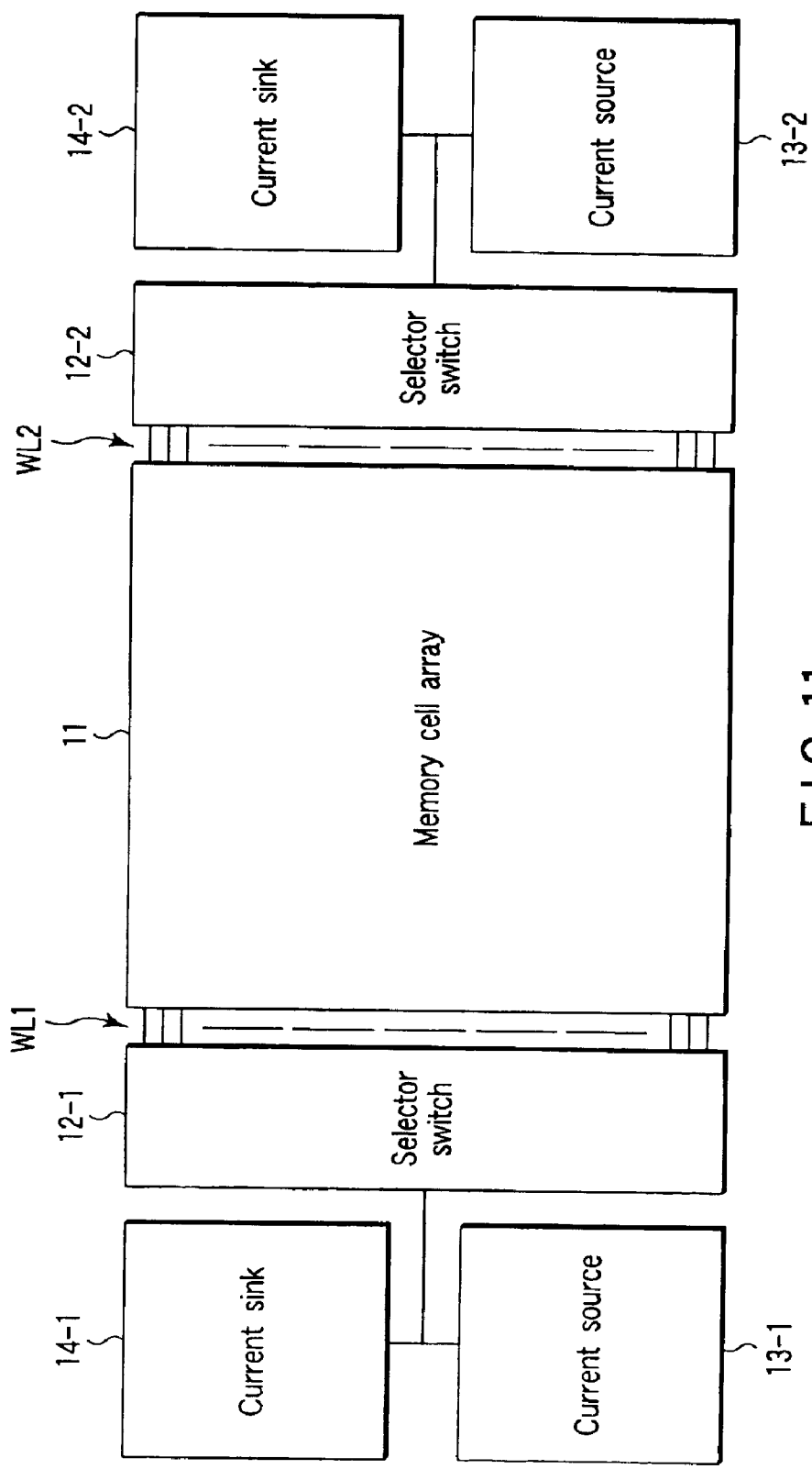
FIG. 11 is a block diagram obtained by rewriting the block diagram shown in FIG. 10 by using an actual circuit names to be used in a write operation.

FIG. 11 is a block diagram obtained by rewriting the block diagram shown in FIG. 10 by using an actual circuit names to be used in a write operation. In the example shown in FIG. 11, current sources 13-1 and 13-2 act as constant current circuits while the current sinks 14-1 and 14-2 also function as current peak suppressing circuits.

Figure 12:
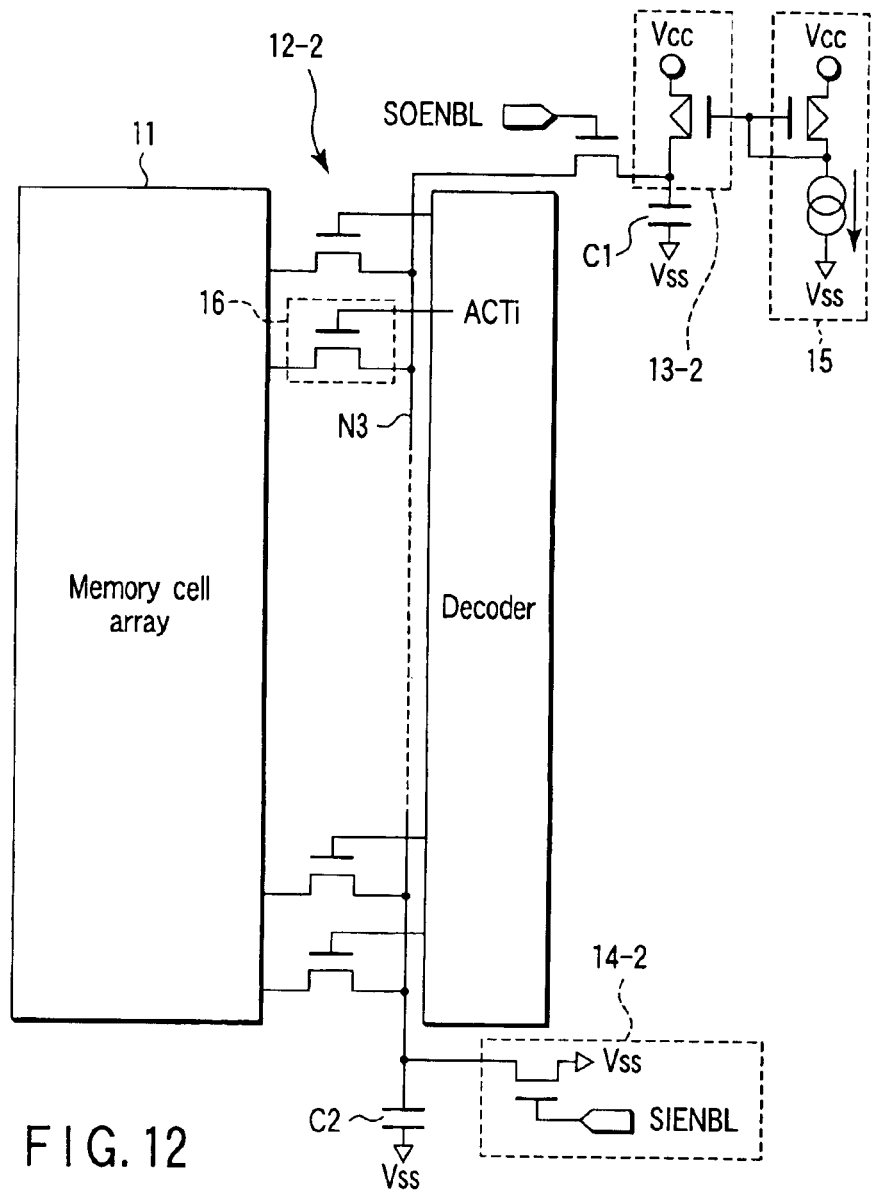
FIG. 12 is a circuit diagram showing a detailed example of the arrangement of a current peak suppressing circuit in the MRAM shown in FIG. 11.

FIG. 12 is a circuit diagram showing a detailed example of the circuit arrangement of the current peak suppressing circuit in the MRAM shown in FIG. 11. At least one constant current control voltage generation circuit 15 is arranged in the chip. An output from the circuit 15 is supplied to the current source 13-2. Even in this embodiment, a circuit formed by connecting the constant current control voltage generation circuit 15 and current source 13-2 by current mirror connection is shown. The output line from the current source 13-2 has a parasitic capacitance C1 which is charged to a power supply voltage (Vcc). A dedicated switch (an NMOS transistor whose gate receives a signal SOENBL is shown in FIG. 12) is inserted between the output line from the current source 13-2 and a common node N3 of the plurality of selector switches 12-2. An NMOS transistor (an NMOS transistor whose gate receives a signal SIENBL) that functions as the current sink 14-2 is also connected to the common node N3.

Figure 13:
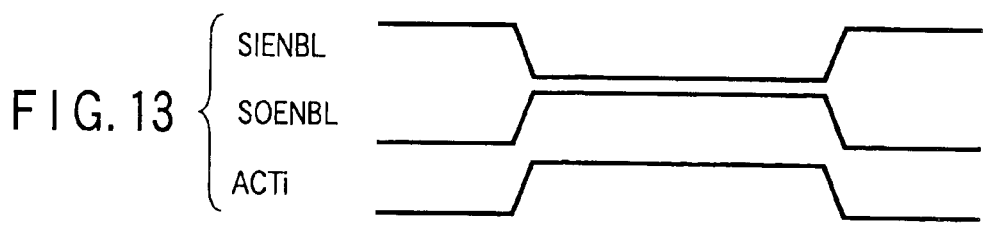
FIG. 13 is an operation timing chart of the current peak suppressing circuit shown in FIG. 12.

As for the operation timing of the circuit shown in FIG. 12, as shown in FIG. 13, only the signal SIENBL is set to "high" in the standby state, thereby setting the common node N3 to a ground potential (Vss). A relatively large parasitic capacitance C2 is connected to the common node N3. In this state, when a write operation request is received from the outside, the signal SIENBL changes from "high" to "low". Simultaneously, the signal SOENBL changes from "low" to "high". In addition, a signal ACTi for the selector switch, which is supplied to the write line connected to a selected cell in accordance with an address, is selectively activated. At this time, charges are distributed between the parasitic capacitance C1 changed to the power supply voltage Vcc on the side of the current source 13-2 and the parasitic capacitance C2 discharged to the ground potential Vss on the side of the current sink 14-2. In this case, the relationship in magnitude between the parasitic capacitances C1 and C2 is important. A current peak caused by the parasitic capacitance C1 at the output portion of the current source 13-2 is absorbed by the parasitic capacitance C2. As a result, the current peak can be suppressed.

Fifth Embodiment

FIG. 14 is a block diagram showing a core portion related to a write for an MRAM so as to explain a semiconductor integrated circuit device according to the fifth embodiment of the present invention. This block diagram corresponds to FIG. 11. The circuit shown in FIG. 14 is different from FIG. 11 in that current peak suppressing circuits 14-1 and 14-2 are implemented by current sources, and constant current circuits 13-1 and 13-2 are implemented by current sinks. The remaining fundamental components are the same as in FIG. 11. The same reference numerals as in FIG. 11 denote the same parts in FIG. 14, and a detailed description thereof will be omitted.

Figure 15:
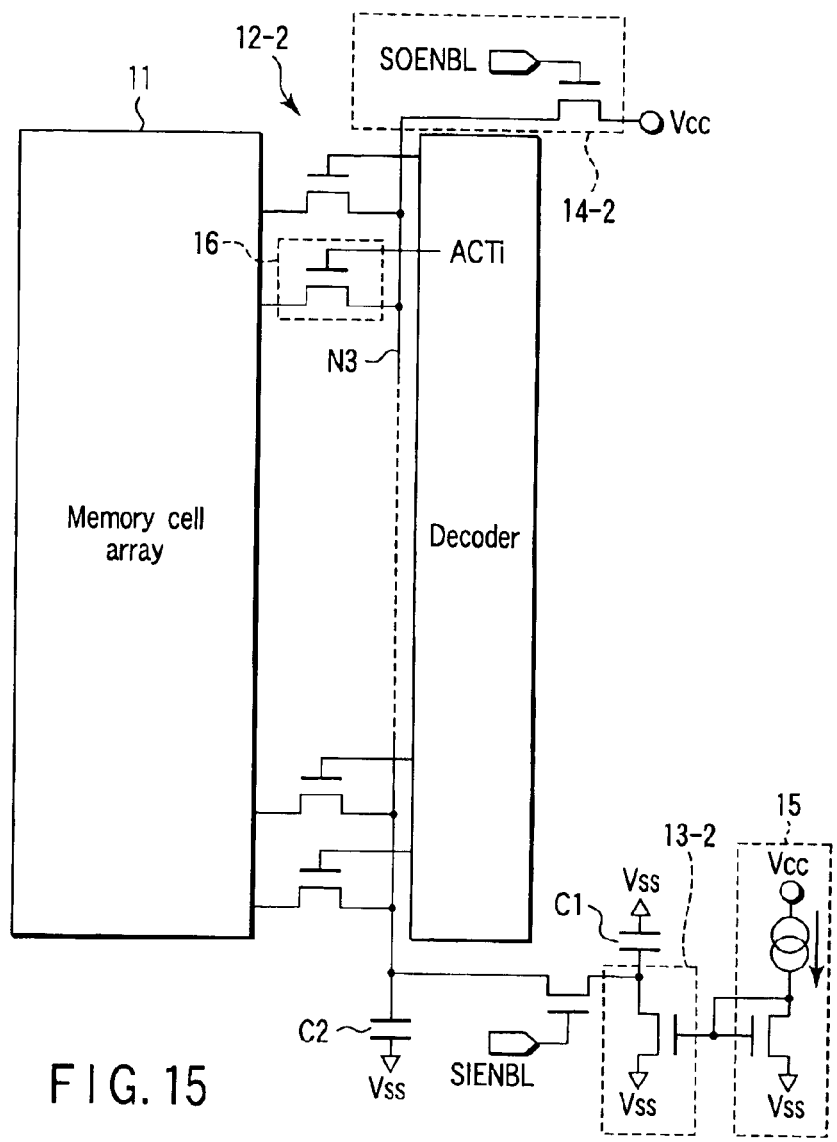
FIG. 15 is a circuit diagram showing a detailed example of the arrangement of a current peak suppressing circuit in the MRAM shown in FIG. 14.

FIG. 15 shows a detailed example of the circuit arrangement of the current peak suppressing circuit in the MRAM according to the fifth embodiment of the present invention. A constant current control voltage generation circuit 15 is incorporated on the side of the current sink 13-2. The remaining components are the same as in the circuit shown in FIG. 12.

Figure 16:
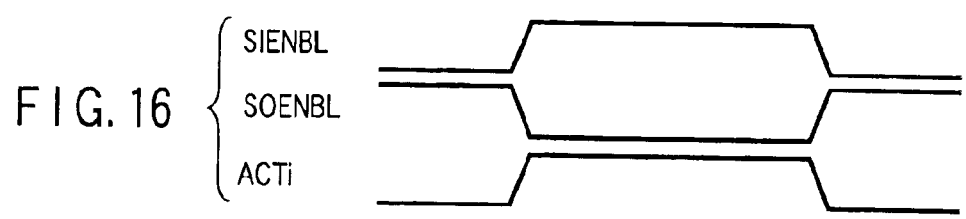
FIG. 16 is an operation timing chart of the current peak suppressing circuit shown in FIG. 15.

FIG. 16 shows the operation timing of this circuit. In the standby state, a common node N3 including a parasitic capacitance C2 is charged to a power supply voltage Vcc by a signal SOENBL. An output from the current sink 13-2 including a parasitic capacitance C1 is discharged to a ground potential Vss.

Even in this arrangement, a current peak caused by the parasitic capacitance at the output portion of the current source 14-2 is absorbed by the parasitic capacitance C2 by the charge distribution function between the parasitic capacitances C1 and C2, as in the above-described fourth embodiment. As a result, the current peak can be suppressed.

Sixth Embodiment

FIG. 17 is a block diagram showing a core portion related to a write for an MRAM so as to explain a semiconductor integrated circuit device according to the sixth embodiment of the present invention. This circuit arrangement aims at largely reducing the chip size by causing two adjacent memory cell blocks 11A and 11B to share both a constant current circuit 13-2 and a current peak suppressing circuit 14-2. Only switch circuits 12-1A, 12-2A, 12-1B, and 12-2B are arranged on both sides of the memory cell blocks 11A and 11B. Current peak suppressing circuits 14-1A, 14-2, and 14-2B and constant current circuits 13-1A, 13-2, and 13-2B are separated from the switch circuits 12-1A, 12-2A, 12-1B, and 12-2B. Hence, adjacent blocks can share the current peak suppressing circuits and constant current circuits.

As described above, according to each embodiment of the present invention, in an MRAM that employs a constant current write method, a current peak generated immediately after application of a write current can be reduced.

Especially, in the first to third embodiments, the constant current circuit for the write is connected to the first power supply (first potential supply source). The plurality of select switch circuits are connected to the constant current circuit to selectively drive a write line. Before the timing of write current application, the constant current circuit and the write-line-side node of the switch circuits are connected in advance to the second power supply (second potential supply source) which has a potential different from that of the first power supply connected to the constant current circuit. With this arrangement, the current peak is suppressed.

In the fourth to sixth embodiments, before the timing of write current application, the common node of the select switch circuits is connected in advance to the second power supply that is different from the first power supply connected to the constant current. With this arrangement, the current peak is suppressed. In addition, when the current peak suppressing circuit is incorporated in the select switch, the plurality of adjacent memory cell blocks can share the constant current circuit. When the current peak suppressing circuit is not incorporated in the select switch circuit, the plurality of adjacent memory cell blocks can share both the constant current circuit and the current peak suppressing circuit. In this case, any increase in chip size can also be suppressed. Hence, an MRAM which has a large write margin and high reliability and can easily realize a high density with a small chip size can be implemented.

The magnetic random access memories (semiconductor memory devices) according to the first to sixth embodiments of the present invention can be applied to various apparatuses. FIGS. 18 to 24 show some application examples.

APPLICATION EXAMPLE 1

Figure 18:
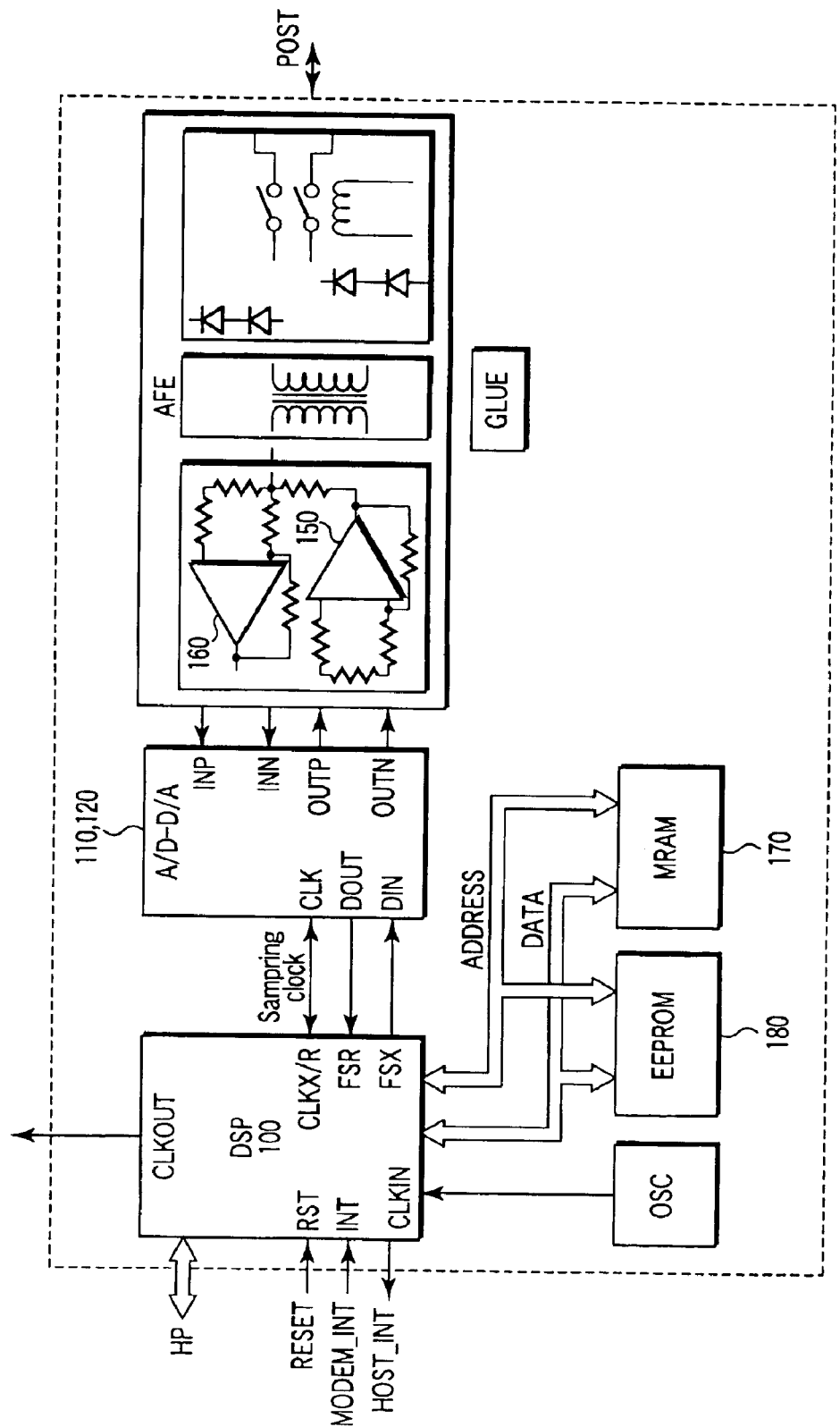
FIG. 18 is a block diagram showing the DSL (Digital Subscriber Line) data path portion of a DSL modem so as to explain Application Example 1 of the semiconductor integrated circuit devices (MRAMs) according to the first to sixth embodiments of the present invention.

FIG. 18 shows the DSL (Digital Subscriber Line) data path portion of a DSL modem. This modem includes a programmable digital signal processor (DSP) 100, analog/digital (A/D) converter 110, digital/analog (D/A) converter 120, transmission driver 150, and receiver amplifier 160. FIG. 18 does not illustrate a band-pass filter. Instead, a magnetic random access memory 170 according to one of the embodiments and an EEPROM 180 are illustrated as optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)).

In Application Example 1, two kinds of memories, i.e., the magnetic random access memory 170 and EEPROM 180 are used as memories to hold the line code program. The EEPROM 180 may be replaced with a magnetic random access memory. That is, instead of using two types of memories, only magnetic random access memories may be used. APPLICATION EXAMPLE 2

Figure 19:
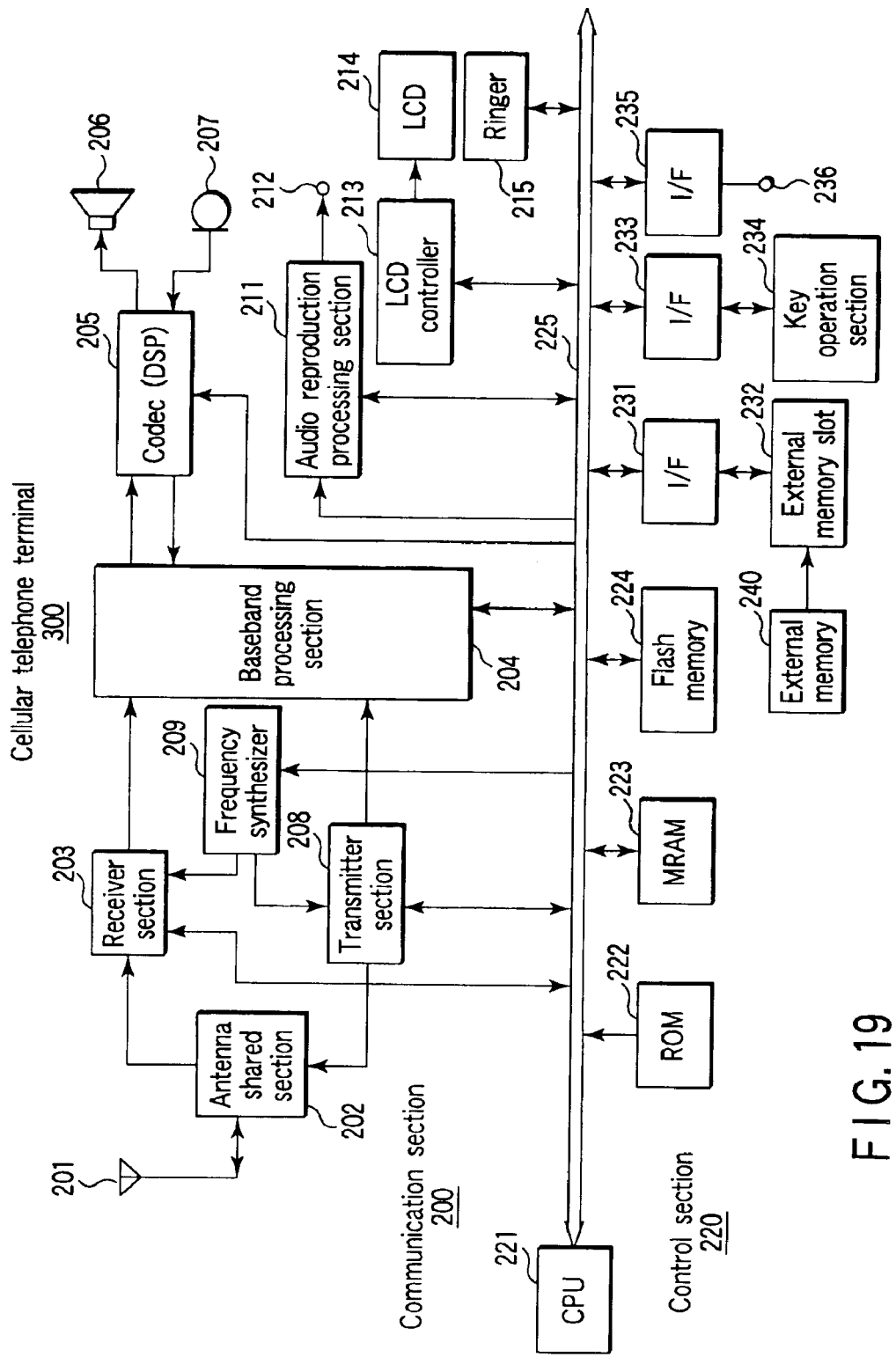
FIG. 19 is a block diagram showing a cellular telephone terminal so as to explain Application Example 2 of the semiconductor integrated circuit devices (MRAMs) according to the first to sixth embodiments of the present invention.
Figure 20:
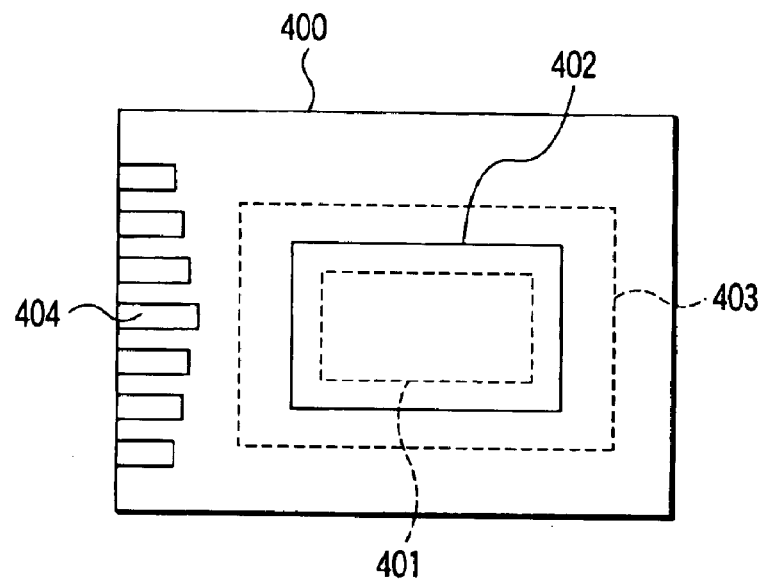
FIG. 20 is a plan view showing an example in which an MRAM is applied to a card (MRAM card) as a smart medium which stores media contents so as to explain Application Example 3 of the semiconductor integrated circuit devices (MRAMs) according to the first to sixth embodiments of the present invention.

FIG. 19 shows a cellular telephone terminal 300 as another application example. A communication section 200 which implements a communication function comprises a transmitting/receiving antenna 201, an antenna shared section 202, a receiver section 203, a baseband processing section 204, a DSP 205 used as a voice codec, a loudspeaker (receiver) 206, a microphone (transmitter) 207, a transmitter section 208, and a frequency synthesizer 209.

The cellular telephone terminal 300 has a control section 220 which controls the sections of the cellular telephone terminal. The control section 220 is a microcomputer which is formed by connecting a CPU 221, a ROM 222, a magnetic random access memory (MRAM) 223 according to one of the embodiments, and a flash memory 224 through a CPU bus 225. The ROM 222 stores, in advance, a program to be executed by the CPU 221 and necessary data such as fonts to be displayed. The MRAM 223 is mainly used as a work area where the CPU 221 stores, as needed, data midway through calculation during executing the program, or data exchanged between the control section 220 and the respective sections are temporarily stored. Even when the cellular telephone terminal 300 is powered off, the flash memory 224 stores, e.g., the immediately preceding set conditions, so the same set conditions can be used when the cellular telephone terminal is powered on again. Accordingly, even when the cellular telephone terminal is powered off, the stored set parameters are not erased.

The cellular telephone terminal 300 also has an audio reproduction processing section 211, an external output terminal 212, an LCD (Liquid Crystal Display) controller 213, an LCD 214 for display, and a ringer 215 which generates a ringing signal. The audio reproduction processing section 211 reproduces audio information input to the cellular telephone terminal 300 (or audio information stored in an external memory 240 (to be described later)). The audio information that is reproduced can be transmitted to a headphone or a portable loudspeaker through the external output terminal 212 and extracted to the outside. When the audio reproduction processing section 211 is prepared, audio information can be reproduced. The LCD controller 213 receives display information from, e.g., the CPU 221 through the CPU bus 225, converts the display information into LCD control information to control the LCD 214, and drives the LCD 214 to cause it to perform display.

The cellular telephone terminal 300 also has interface circuits (I/Fs) 231, 233, and 235, the external memory 240, an external memory slot 232, a key operation section 234, and an external input/output terminal 236. The external memory slot 232 receives the external memory 240 such as a memory card. The external memory slot 232 is connected to the CPU bus 225 through the interface circuit (I/F) 231. As described above, when the slot 232 is prepared in the cellular telephone terminal 300, information in the cellular telephone terminal 300 can be written in the external memory 240. Alternatively, information (e.g., audio information) stored in the external memory 240 can be input to the cellular telephone terminal 300. The key operation section 234 is connected to the CPU bus 225 through the interface circuit (I/F) 233. Key input information input from the key operation section 234 is transmitted to, e.g., the CPU 221. The external input/output terminal 236 is connected to the CPU bus 225 through the interface circuit (I/F) 233 and functions as a terminal in inputting various kinds of external information to the cellular telephone terminal 300 or outputting information externally from the cellular telephone terminal 300.

In Application Example 2, the ROM 222, MRAM 223, and flash memory 224 are used. The flash memory 224 may be replaced with a magnetic random access memory. The ROM 222 may also be replaced with a magnetic random access memory.

APPLICATION EXAMPLE 3

FIGS. 20 to 24 show an example in which a magnetic random access memory is applied to a card (MRAM card) as a smart medium which stores media contents.

An MRAM card main body 400 incorporates an MRAM chip 401. An opening portion 402 is formed in the card main body 400 at a position corresponding to the MRAM chip 401 so the MRAM chip 401 is exposed. The opening portion 402 has a shutter 403. When the MRAM card is carried, the MRAM chip 401 is protected by the shutter 403. The shutter 403 is made of a material such as a ceramic capable of shielding an external magnetic field. When data is to be transferred, the shutter 403 is opened to expose the MRAM chip 401. An external terminal 404 is used to extract content data stored in the MRAM card.

Figure 21:
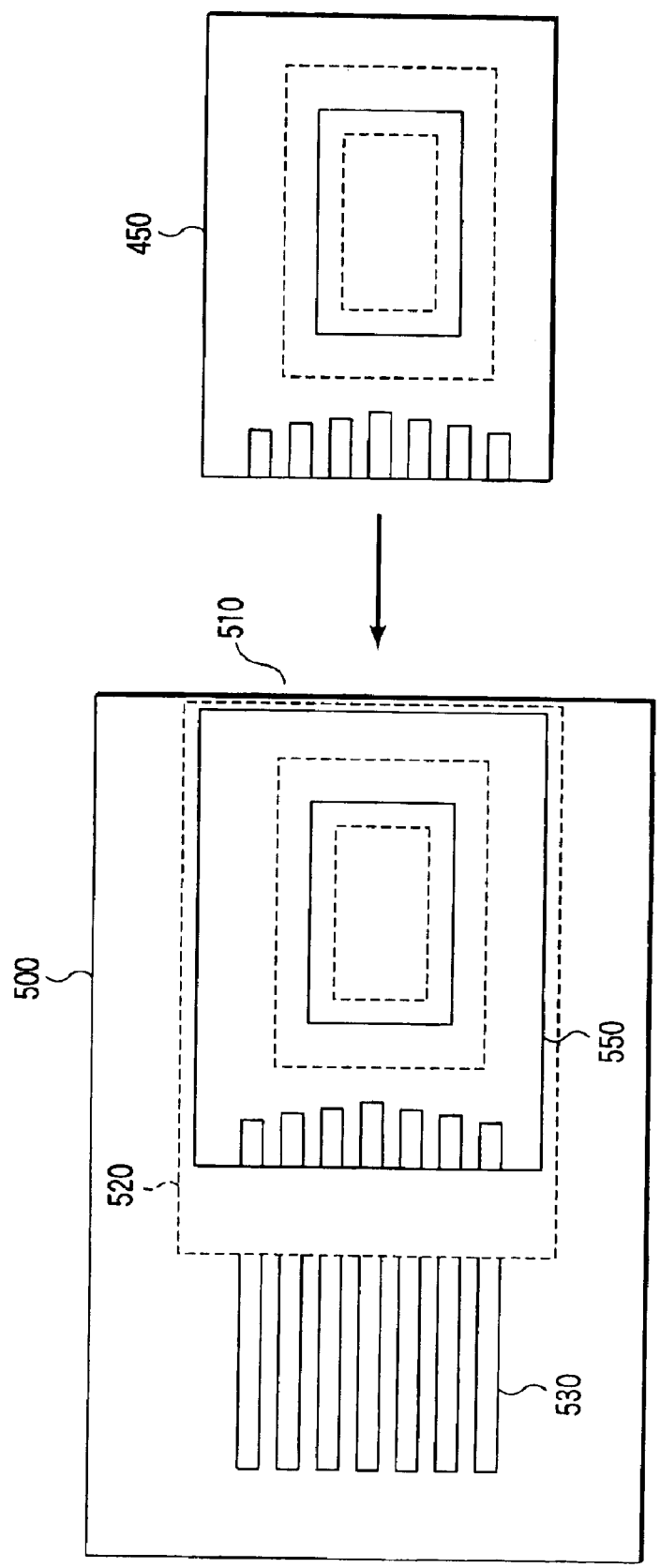
FIG. 21 is a plan view showing a transfer apparatus to transfer data to an MRAM card.
Figure 22:
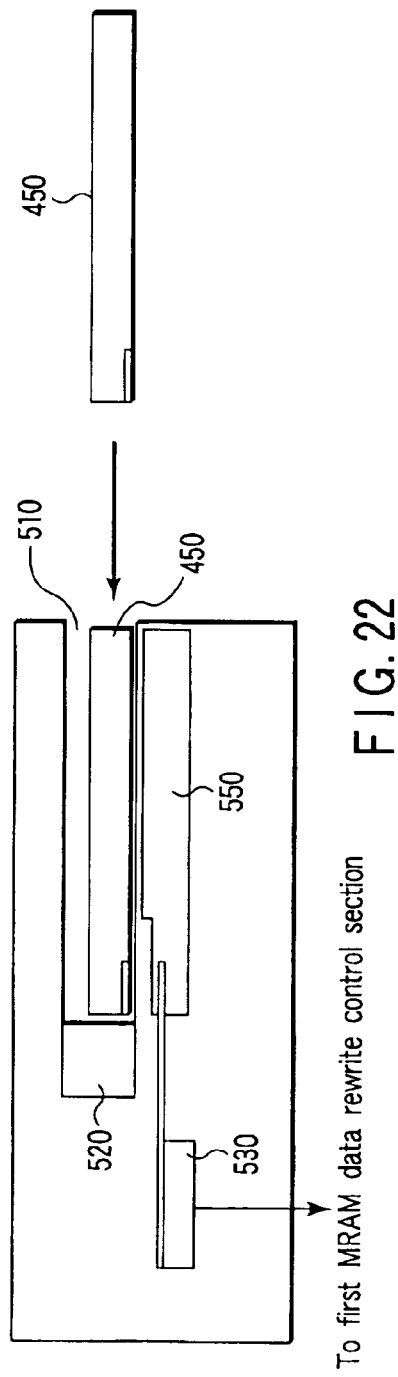
FIG. 22 is a sectional view showing the transfer apparatus to transfer data to an MRAM card.

FIGS. 21 and 22 show a transfer apparatus which transfers data to the MRAM card. FIG. 21 is a plan view of a card insertion type transfer apparatus. FIG. 22 is a sectional view of the transfer apparatus. A second MRAM card 450 used by an end user is inserted from an insertion portion 510 of a transfer apparatus 500, as indicated by the arrow, and pushed into until the card abuts against a stopper 520. The stopper 520 also functions as a member to align a first MRAM 550 and the second MRAM card 450. When the second MRAM card 450 is located at a predetermined position, a control signal is supplied from a first MRAM rewrite control section to an external terminal 530. Accordingly, data stored in the first MRAM 550 is transferred to the second MRAM card 450.

Figure 23:
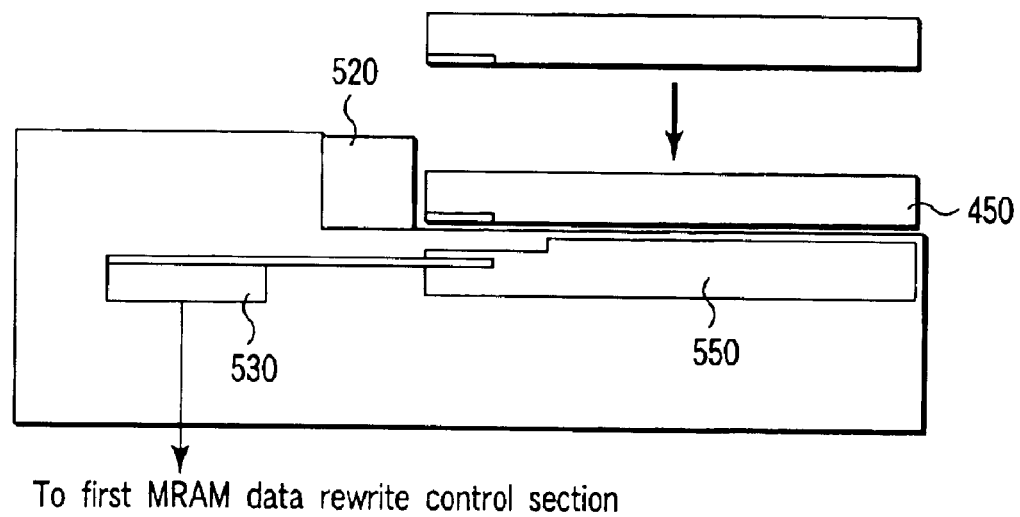
FIG. 23 is a sectional view showing a fitting type transfer apparatus to transfer data to an MRAM card.

FIG. 23 shows a fitting type transfer apparatus. In this transfer apparatus, the second MRAM card 450 is fitted on the first MRAM 550 with reference to the stopper 520, as indicated by the arrow. The transfer method is the same as in the card insertion type, and a description thereof will be omitted.

Figure 24:
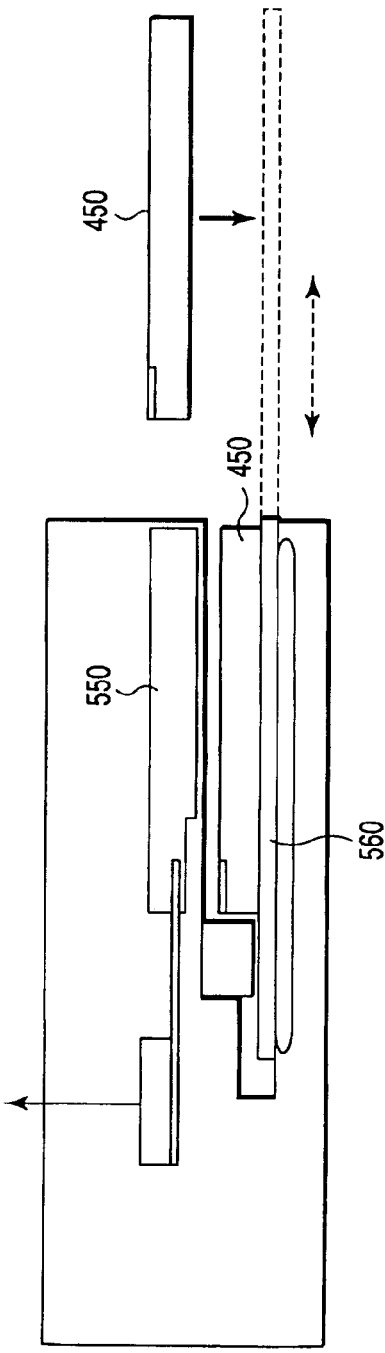
FIG. 24 is a sectional view showing a slide type transfer apparatus to transfer data to an MRAM card.

FIG. 24 shows a slide type transfer apparatus. The transfer apparatus has a sliding tray 560, like a CD-ROM drive or DVD drive. The sliding tray 560 moves, as indicated by the arrow. When the sliding tray 560 moves to the position indicated by the broken line, the second MRAM card 450 is mounted on the sliding tray 560 and conveyed into the transfer apparatus 500. The structure that conveys the second MRAM card 450 until it abuts against the stopper 520 and the transfer method are the same as in the card insertion type, and a description thereof will be omitted.

In the above embodiments, a magnetic random access memory has been described as an example of a semiconductor integrated circuit device. However, the present invention can also be applied to a semiconductor integrated circuit device in which a magnetic random access memory and logic circuit are embedded, or a semiconductor integrated circuit device called a SOC in which a system is mounted in one chip.

As described above, before the timing of write current application, the node at one of the two terminals of each switch circuit is short-circuited to the power supply to which the constant current source is connected. With this arrangement, the initial current peak that flows to the write line can be suppressed. Accordingly, a large write operation margin can be obtained, and the reliability can be increased.

Hence, according to one aspect of the present invention, a reliable semiconductor integrated circuit device which can suppress the current peak that is generated immediately after the start of the write operation and has a large write operation margin can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a memory cell array in which memory cells each of which stores information by using a magneto-resistive effect are arranged in a matrix;
a constant current circuit which is connected to a first potential supply source and used to write data in each memory cell in the memory cell array; and
a current peak suppressing circuit configured to suppress a current peak that is generated at a write start timing due to charges which flow out from a parasitic capacitance connected to an output terminal of the constant current circuit or charges which flow into the parasitic capacitance, the current peak suppressing circuit having switch circuits to selectively supply an output from the constant current circuit to a specific write line, and a circuit portion which connects one of two terminals of each of the switch circuits to a second potential supply source having a potential different from that of the first potential supply source before the timing of the start of the write operation and short-circuits the two terminals of each of the switch circuits immediately after the start of the write operation.

2. A device according to claim 1, wherein the current peak suppressing circuit is connected to each write line.

3. A device according to claim 2, wherein the current peak suppressing circuit is a current sink connected to each write line.

4. A device according to claim 3, wherein the constant current circuit is a current source and is shared by at least two current sinks.

5. A device according to claim 3, wherein each write line is set to a ground potential by the current sink in a standby mode.

6. A device according to claim 2, wherein the current peak suppressing circuit is a current source connected to each write line.

7. A device according to claim 6, wherein the constant current circuit is a current sink and is shared by at least two current sources.

8. A device according to claim 7, wherein each write line is set to a power supply potential by the current source in a standby mode.

9. A device according to claim 2, wherein there exists a period during which both a switch element of the switch circuit, which is connected to a write line connected to a memory cell to be write-accessed, and an element that constitutes the current peak suppressing circuit are set in an ON state at the start of the write operation.

10. A device according to claim 1, wherein the current peak suppressing circuit are separated, through a dedicated switch element, from the switch circuits connected to the write lines.

11. A device according to claim 10, wherein the current peak suppressing circuit is a current sink shared by a plurality of write lines.

12. A device according to claim 11, wherein the constant current circuit is a current source and is shared by at least two write lines.

13. A device according to claim 12, wherein each write line is set to a ground potential by the current sink in a standby mode.

14. A device according to claim 10, wherein the current peak suppressing circuit is a current source connected to each write line.

15. A device according to claim 14, wherein the constant current circuit is a current sink and is shared by at least two write lines.

16. A device according to claim 15, wherein each write line is set to a power supply potential by the current source in a standby mode.

17. A device according to claim 10, wherein the dedicated switch element to separate the current peak suppressing circuit from the switch circuits connected to the write lines is exclusively ON/OFF-controlled so as to or not to be electrically connected to the current peak suppressing circuit.

18. A semiconductor integrated circuit device comprising:
a plurality of memory cell blocks in which memory cells each of which stores information by using a magneto-resistive effect are arranged in a matrix;
a constant current circuit which is used to write data in each memory cell in the memory cell blocks, the constant current circuit being shared by two adjacent memory cell blocks;
switch circuits which are arranged in correspondence with each memory cell block and configured to selectively connect an output from the constant current circuit to a specific write line; and
a current peak suppressing circuit configured to suppress a current peak at a timing of a start of a write operation.

19. A semiconductor integrated circuit device comprising:
a plurality of memory cell blocks in which memory cells each of which stores information by using a magneto-resistive effect are arranged in a matrix;
a constant current circuit which is used to write data in each memory cell in the memory cell blocks;
switch circuits which are arranged in correspondence with each memory cell block and configured to selectively connect an output from the constant current circuit to a specific write line; and
a current peak suppressing circuit configured to suppress a current peak at a timing of a start of a write operation,
wherein the constant current circuit and the current peak suppressing circuit are shared by two adjacent memory cell blocks.

20. A semiconductor integrated circuit device comprising:
write lines to write information in memory cells each of which stores information by using a magneto-resistive effect;
a constant current circuit which is connected to a first potential supply source and used to write data in the memory cells;
switch circuits each having one terminal connected to a corresponding one of the write lines and the other terminal connected to an output terminal of the constant current circuit in parallel; and
a current peak suppressing circuit which has a circuit portion to which said one terminal of each of the switch circuits is connected and is configured to connect one of the two terminals of each of the switch circuits to a second potential supply source having a potential different from that of the first potential supply source before a timing of a start of a write operation and short-circuit the two terminals of each of the switch circuits immediately after the start of the write operation.

* * * * *